United States Patent
Ploeg et al.

(10) Patent No.: US 7,495,922 B2
(45) Date of Patent: Feb. 24, 2009

(54) SPRING LOADED HEAT SINK RETENTION MECHANISM

(75) Inventors: Johan F. Ploeg, Hillsboro, OR (US); Seri Lee, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 50 days.

(21) Appl. No.: 11/729,539

(22) Filed: Mar. 29, 2007

(65) Prior Publication Data

US 2008/0239678 A1 Oct. 2, 2008

(51) Int. Cl.
*H05K 7/20* (2006.01)

(52) U.S. Cl. ............... 361/719; 361/704; 257/718; 257/719

(58) Field of Classification Search ........... None
See application file for complete search history.

(56) References Cited

U.S. PATENT DOCUMENTS

| | | | | |
|---|---|---|---|---|
| 6,055,159 A * | 4/2000 | Sun | | 361/704 |
| 6,317,328 B1 * | 11/2001 | Su | | 361/704 |
| 6,549,410 B1 * | 4/2003 | Cohen | | 361/704 |
| 6,826,054 B2 * | 11/2004 | Liu | | 361/719 |
| 6,850,411 B1 * | 2/2005 | Patel | | 361/704 |
| 7,080,989 B2 * | 7/2006 | Gates | | 439/73 |
| 7,262,969 B2 * | 8/2007 | Lee et al. | | 361/704 |
| 2004/0075168 A1 * | 4/2004 | Azuma | | 257/718 |
| 2005/0072558 A1 * | 4/2005 | Whitney et al. | | 165/80.3 |
| 2008/0130238 A1 * | 6/2008 | Yang | | 361/719 |

* cited by examiner

*Primary Examiner*—Boris L Chervinsky
(74) *Attorney, Agent, or Firm*—Caven & Aghevli LLC

(57) ABSTRACT

Methods and apparatus to provide a spring loaded heat dissipative device retention mechanism are described. In one embodiment, one or more pins with spring portions are used to maintain a spring force between a heat dissipative device and a printed circuit board. Other embodiments are also described.

13 Claims, 4 Drawing Sheets

SPRING LOADED HEAT SINK RETENTION MECHANISM

BACKGROUND

The present disclosure generally relates to the field of electronics. More particularly, an embodiment of the invention generally relates to a spring loaded heat sink retention mechanism.

As integrated circuit fabrication technology improves, manufacturers are able to integrate additional functionality onto a single silicon substrate. As the number of the functionalities increases, however, so does the number of components on a single IC chip. Additional components add additional signal switching, in turn, generating more heat. The additional heat may damage an IC chip by, for example, thermal expansion. Also, the additional heat may limit usage locations and/or applications of a computing device that includes such chips.

To limit damage resulting from higher temperatures, some implementations may use a heat sink that is attached to an IC chip to dissipate the heat generated by the IC chip. Some implementations may use a wave solder heat sink (WSHS) that may be attached to the IC chip prior to shipment from a supplier. Generally, WSHS may be used to provide a relatively low-cost heat sink solution when compared with heat sinks that may be installed after shipment from a supplier. In particular, during the wave soldering process the initial contact pressure at the thermal interface material between the heat sink and the IC chip may be provided by mechanical compression. However, long-term failure may occur due to subsequent relative movement of parts (which may also be referred to as "creep" flow) and relaxation of pressure applied at initial installation. Thus, in time, the parts under force may relax, e.g., due to slow and persistent material flow mechanism, causing eventual failure of the thermal interface material as the contact pressure is diminished to the point that the thermal interface material may no longer meet the performance requirement. Hence, long term reliability of WSHS may degrade over time, especially when exposed to elevated temperatures.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Figure 1A:
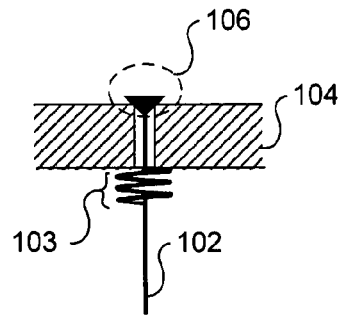
FIGS. 1A-4 illustrate side views of various spring loaded configurations in accordance with some embodiments of the invention.

Some embodiments discussed herein (e.g., with reference to FIGS. 1A-6) may improve heat sink reliability by utilizing a spring loaded retention mechanism. As discussed herein, the use of "heat sink" is intended to refer to any heat dissipative material or device, including for example a heat sink, a flat heat-pipe (which may also be called a "vapor chamber"), a conduction cooled cold plate (which may be utilized in electronic racks (chassis) used in avionics applications and laptop computers where the z-thickness may be limited, etc.), a liquid filled radiator (e.g., cooled via a compressor), combinations thereof, etc. More particularly, FIGS. 1A-3B illustrate side views of several types of the spring loaded configurations that may be utilized in accordance with various embodiments of the invention. For illustrative purposes, FIGS. 1A, 1B, and 1C show cross-sectional views the configurations at the point (e.g., a drilled hole) where a pin (e.g., pins 102, 202, or 302) passes through a heat sink 104.

More particularly, FIG. 1A illustrates a spring loaded pin 102 with a spring portion 103 of the pin being provided below a heat sink 104. As shown in FIG. 1A, the pin 102 may include a cap portion 106, e.g., to limit downward movement of the pin 102 relative to the heat sink 104. In some embodiments, the cap portion 106 may be provided by various mechanisms such as a solder connection, a clip, barbing of the end of pin 102, a locking tip, a nut (e.g., where the pin 102 may include a screw tip to engage the nut), etc.

Figure 1B:
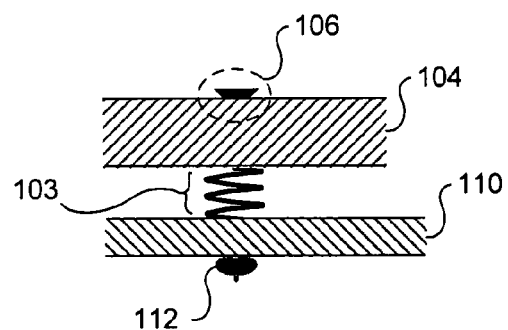

FIG. 1B illustrates the spring loaded pin 102 after it is coupled to a substrate such as a printed circuit board (PCB) 110. In an embodiment, the pin 102 may be coupled to the PCB 110 with a solder 112. However, in some embodiments, the pin 102 may be coupled to the PCB 110 with other mechanisms such as a clip, barbing of the end of pin 102, a locking tip, a nut (e.g., where the pin 102 may include a screw tip to engage the nut), etc. Also, in an embodiment, the pin 102 may be coupled to the PCB 110 after the spring portion 103 is adjusted (e.g., extended), e.g., to introduce a spring force to maintain the distance between the heat sink 104 and the PCB 110, as will be further discussed herein, for example, with reference to FIG. 4. Accordingly, in some embodiments, the configuration shown in FIG. 1B may provide a wave solder heat sink (WSHS) device that utilizes a spring portion 103 of the pin 102 to improve reliability of the WSHS over time, e.g., by addressing creep flow issues.

Figure 2A:
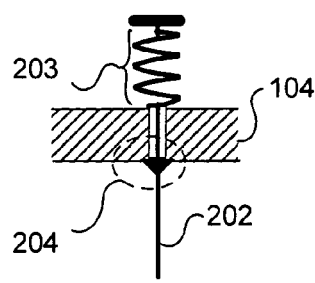

FIG. 2A illustrates a spring loaded pin 202 with a spring portion 203 of the pin being provided above the heat sink 104. As shown in FIG. 2A, the pin 202 may include a retaining portion 204, e.g., to limit upward movement of the pin 102 relative to the heat sink 104. In some embodiments, the retaining portion 204 may be provided by various mechanisms such as a solder connection, a clip, barbing of the end of pin 202, a locking tip, a nut (e.g., where the pin 202 may include a screw tip to engage the nut), etc.

Figure 2B:
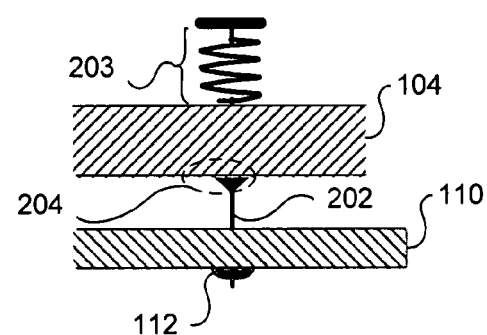

FIG. 2B illustrates the spring loaded pin 202 after it is coupled to a substrate such as the printed circuit board (PCB) 110. In an embodiment, the pin 202 may be coupled to the PCB 110 with the solder 112. However, in some embodiments, the pin 202 may be coupled to the PCB 110 with other mechanisms such as a clip, barbing of the end of pin 202, a locking tip, a nut (e.g., where the pin 202 may include a screw tip to engage the nut), etc. Also, in an embodiment, the pin 202 may be coupled to the PCB 110 after the spring portion 203 is adjusted (e.g., compressed), e.g., to introduce a spring force to maintain the distance between the heat sink 104 and the PCB 110, as will be further discussed herein, for example, with reference to FIG. 4. Accordingly, in some embodiments, the configuration shown in FIG. 2B may provide a wave solder heat sink (WSHS) device that utilizes a spring portion 203 of the pin 202 to improve reliability of the WSHS over time, e.g., by addressing creep flow issues.

Figure 3A:
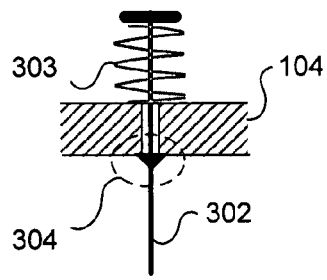

FIG. 3A illustrates a pin 302 that is passed through a spring 303. As shown in FIG. 3A, the spring 303 may be provided above the heat sink 104. Furthermore, the pin 302 may include a retaining portion 304, e.g., to limit upward movement of the pin 102 relative to the heat sink 104. In some embodiments, the retaining portion 304 may be provided by various mechanisms such as a solder connection, a clip, barbing of the end of pin 302, a locking tip, a nut (e.g., where the pin 302 may include a screw tip to engage the nut), etc.

Figure 3B:
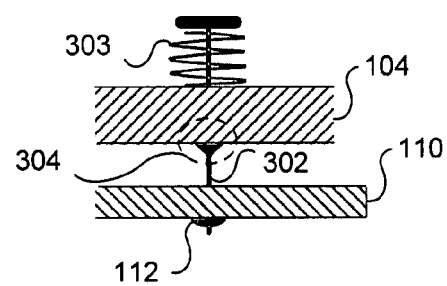

FIG. 3B illustrates the spring loaded pin 302 after it is coupled to a substrate such as the printed circuit board (PCB) 110. In an embodiment, the pin 302 may be coupled to the PCB 110 with the solder 112. However, in some embodiments, the pin 302 may be coupled to the PCB 110 with other mechanisms such as a clip, barbing of the end of pin 302, a locking tip, a nut (e.g., where the pin 302 may include a screw tip to engage the nut), etc. Also, in an embodiment, the pin 302 may be coupled to the PCB 110 after the spring 303 is adjusted (e.g., compressed), e.g., to introduce a spring force to maintain the distance between the heat sink 104 and the PCB 110, as will be further discussed herein, for example, with reference to FIG. 4. Accordingly, in some embodiments, the configuration shown in FIG. 3B may provide a wave solder heat sink (WSHS) device that utilizes a spring 303 with the pin 302 to improve reliability of the WSHS over time, e.g., by addressing creep flow issues.

Figure 4:
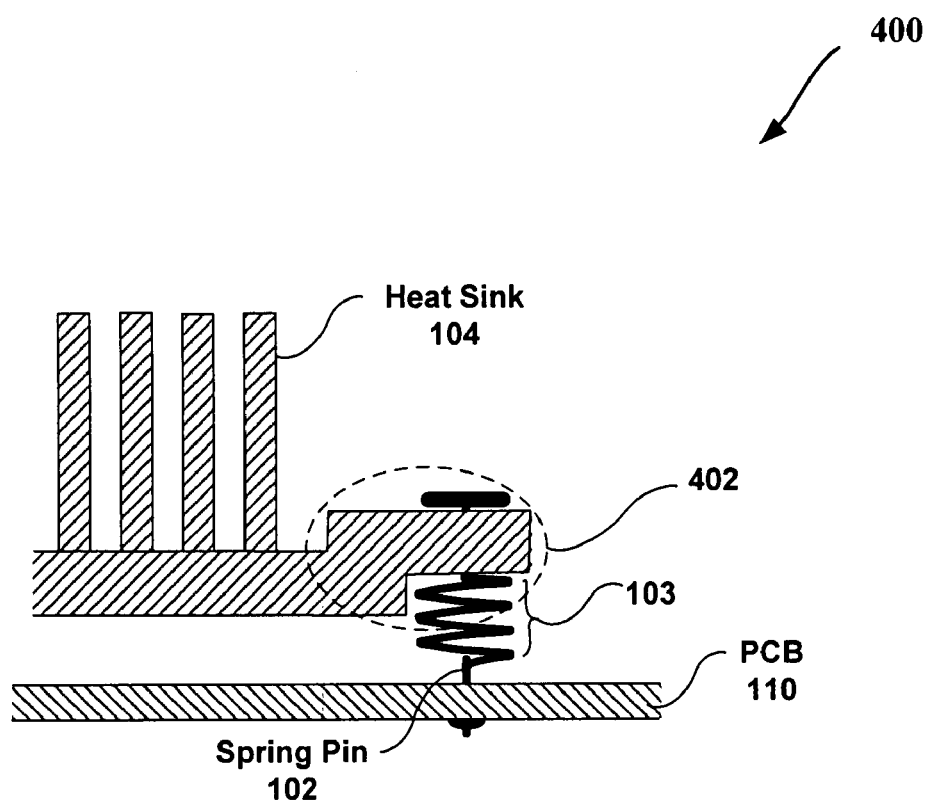

FIG. 4 illustrates a side view of a spring loaded configuration 400, according to an embodiment. As shown in FIG. 4, the pin 102 of FIG. 1A may be utilized to retain the heat sink 104 and the PCB 110. In the embodiment illustrated in FIG. 4, the heat sink 104 may include a portion 402 to guide or retain the spring portion 103 of the pin 102, e.g., to reduce lateral movement of the pin 102. Additionally, in an embodiment, the portion 402 may provide a more space efficient configuration, e.g., to allow for accommodation of a larger and/or stronger spring portion 103. Further, shape of the portion 402 shown in FIG. 4 is only one example. Other profiles may also be used including for example machined rails, blind holes, etc., such that the spring portion 103 may be sunken into the corresponding "well" or "guide-rails."

In some embodiments, the pins discussed with reference to FIGS. 1A-4 may be constructed of any type of material such as cold steel, spring wire, plastic, combinations thereof, etc. with a desired spring constant. As will be further discussed with reference to FIG. 5, once installed the pins of FIGS. 1A-4 may maintain consistent contact pressure (through the provided spring force) on the thermal interface material which may be provided between the heat sink 104 and an IC chip which may be coupled to the PCB 110 on the side facing the heat sink 104. Additionally, some of the embodiments discussed herein (e.g., with reference to FIGS. 1-5) may virtually eliminate the long-term reliability problems associated with creep flow, as they may provide and maintain the contact pressure through a mechanical spring (e.g., spring portions 103 and/or 203 of FIGS. 1B and 2B, respectively, and/or the spring 303 of FIG. 3B) while keeping the relatively lower cost and/or convenience provided by wave solder heat sinks.

Figure 5:
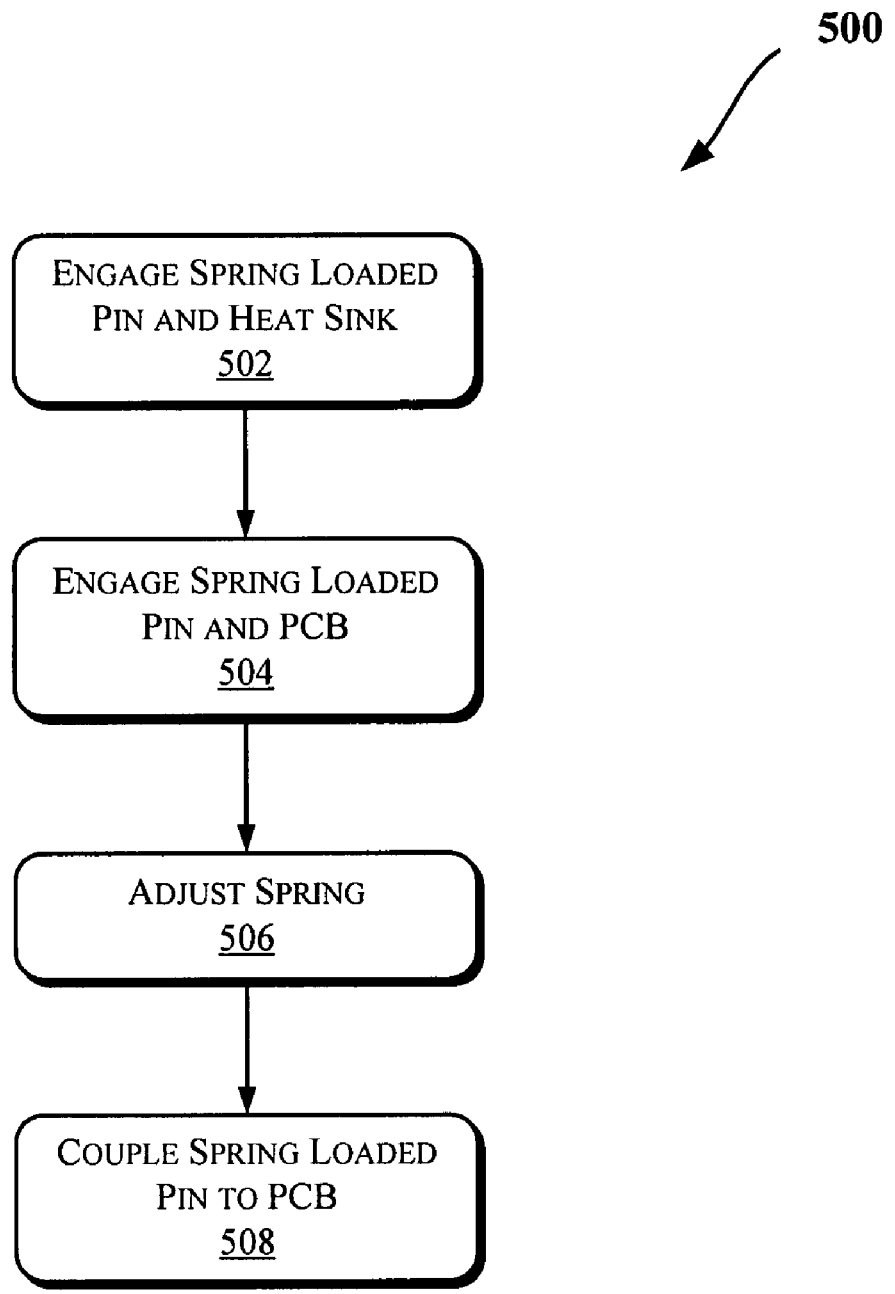
FIG. 5 illustrates a block diagram of a method according to an embodiment.

FIG. 5 illustrates a block diagram of an embodiment of a method 500 to provide a spring loaded heat sink retention mechanism. In an embodiment, various components discussed with reference to FIGS. 1A-4 and 6 may be utilized to perform one or more of the operations discussed with reference to FIG. 5. For example, the method 500 may be used to provide one or more of the devices of FIGS. 1A-4.

Referring to FIGS. 1-5, at an operation 502, a spring loaded pin (e.g., one of the pins of FIGS. 1A-4) may be engaged with a heat sink (e.g., the heat sink 104 of FIGS. 1A-4). In an embodiment, at operation 502, one pin may be provided at one or more corners of a heat sink. Furthermore, at operation 502, the pins (e.g., pins 102, 202, and/or 302) may be permanently attached to the PCB, e.g., via soldering and/or crimping (e.g., at the top and/or bottom side of the heat sink 104) in some embodiments. At an operation 504, the spring loaded pin (e.g., one of the pins of FIGS. 1A-4) may be engaged with a PCB or another substrate (e.g., such as the PCB 110 of FIGS. 1A-4).

In an embodiment, at operation 504, the combination of the heat sink and pin of operation 502 may be placed on a PCB and the pins may be inserted through corresponding pre-drilled holes in the PCB. At an operation 506, one or more springs (e.g., spring portions 103 and/or 203 of FIGS. 1B and 2B, respectively, and/or the spring 303 of FIG. 3B) may be adjusted. For example, at operation 506, the springs may be extended (e.g., in the implementations discussed with reference to FIGS. 1A-1B and 4), such that when attachment of the heat sink, pins, and PCB is complete at an operation 508 and the assembly is released to the free state, the springs in tension may retract to provide a compression force between the base plate of the heat sink and the PCB. Alternatively, at operation 506, the springs may be compressed (e.g., in the implementations discussed with reference to FIGS. 2A-3B), such that when attachment of the heat sink, pins, and PCB is complete at operation 508 and the assembly is released to the free state, the springs in compression may expand to provide a compression force between the base plate of the heat sink and the PCB. Accordingly, at operation 508, the spring loaded pin of operation 506 may be coupled to the PCB (e.g., PCB 110). In some embodiments, at operation 508, soldering (or wave soldering) may be utilized to couple the PCB and pins. However, in some embodiments as discussed with reference to FIGS. 1B, 2B, and 3B, the pins may be coupled to the PCB with other mechanisms such as clips, barbing of the pin ends, locking tips, nuts (e.g., where the pins may include screw tips to engage the nuts), etc.

Figure 6:
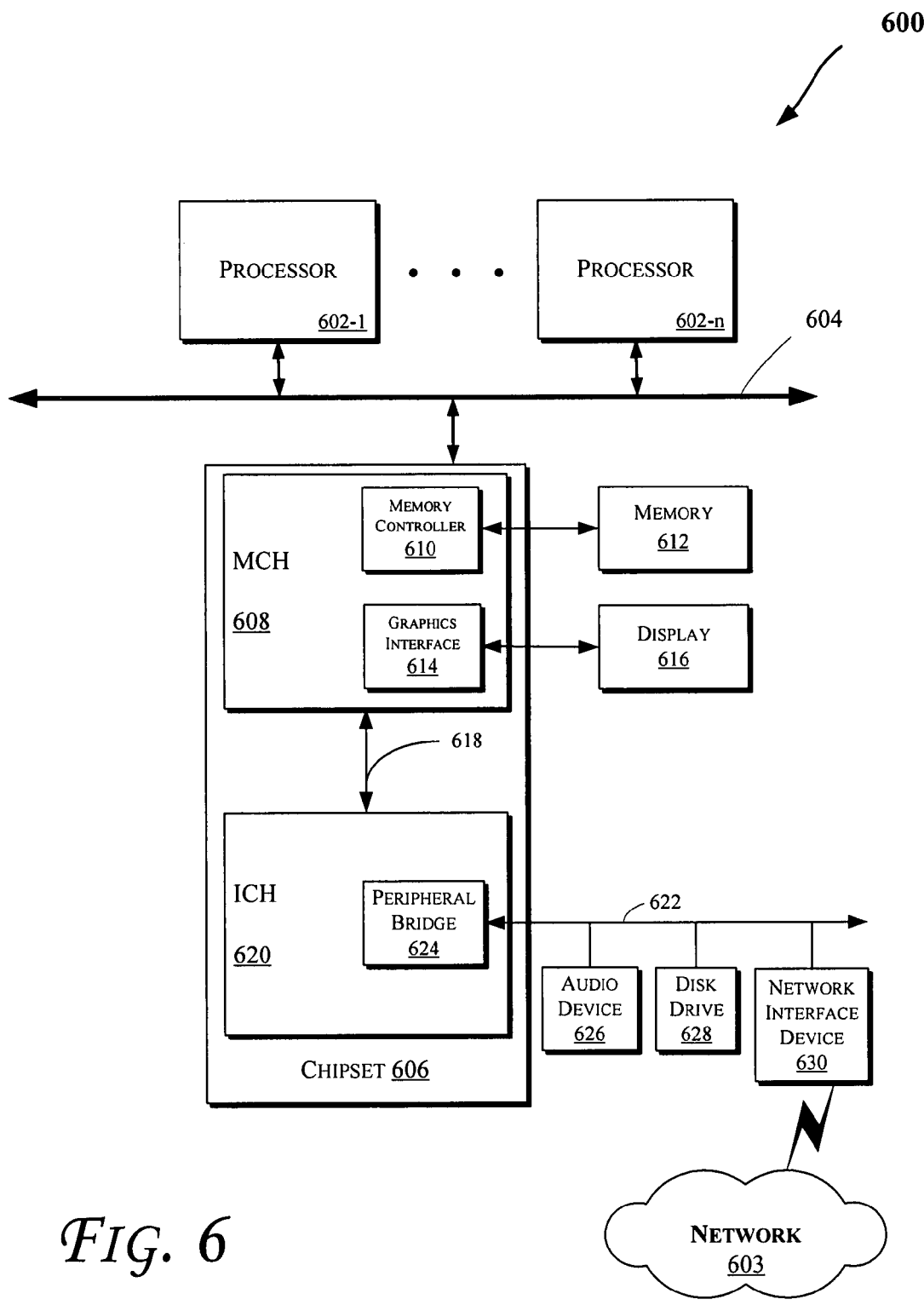
FIG. 6 illustrates a block diagram of a computing system, which may be utilized to implement various embodiments discussed herein.

FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. Moreover, the operations discussed with reference to FIGS. 1-5 may be performed by one or more components of the system 600. Also, one or more of the components of FIG. 6 may be coupled to a PCB by utilizing one or more of the techniques discussed with reference to FIGS. 1A-5. Additionally, system 600 may be used to automate and/or control one or of the operations discussed with reference to FIGS. 1A-5.

A chipset 606 may also communicate with the interconnection network 604. The chipset 606 may include a memory control hub (MCH) 608. The MCH 608 may include a memory controller 610 that communicates with a memory 612. The memory 612 may store data, including sequences of instructions that are executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display 616. In one embodiment of the invention, the graphics interface 614 may communicate with the display 616 via an accelerated graphics port (AGP). In an embodiment of the invention, the display 616 may be a flat panel display that communicates with the graphics interface 614 through, for example, a signal converter that translates a digital representation of an image stored in a storage device such as video memory or system memory into display signals that are interpreted and displayed by the display 616. The display signals produced by the interface 614 may pass through various control devices before being interpreted by and subsequently displayed on the display 616.

A hub interface 618 may allow the MCH 608 and an input/output control hub (ICH) 620 to communicate. The ICH 620 may provide an interface to I/O devices that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and the MCH 608 may be combined to form a single chip. Furthermore, the graphics interface 614 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 600 may be arranged in a point-to-point (PtP) configuration. For example, processors, memory, and/or input/output devices may be interconnected by a number of point-to-point interfaces.

In various embodiments of the invention, the operations discussed herein, e.g., with reference to FIGS. 1A-6, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIG. 6.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An electronic assembly, comprising:
   a circuit board substrate;
   an electronic component disposed on the circuit board substrate; and
   a spring-loaded wave solder heat sink soldered to the circuit board substrate and thermally coupled to the electronic component such that the electronic component is positioned between the spring-loaded wave solder heatsink and the circuit board substrate,
   wherein the spring-loaded wave solder heat sink comprises a spring mechanism to apply a contact pressure between the spring-loaded wave solder heatsink and the electronic component; the spring mechanism comprises at least one pin, wherein each pin comprises a shaft with a pin head at a first end of the shaft, a spring portion and a pointed pin end at a second end of the shaft, wherein the spring portion forms an integral part of the shaft between the pin head and the pointed pin end of the shaft.

2. The assembly of claim 1, wherein the spring-loaded wave solder heat sink comprises:

a guide portion to receive the pin and the spring portion;

wherein the pin is coupled to the circuit board substrate and the spring-loaded wave solder heat sink and the spring portion is to apply the contact pressure between the heat sink and the electronic component.

3. The assembly of claim 2, wherein the spring-loaded wave solder heatsink comprises a plurality of guide portions to receive respective pins and a plurality of corresponding spring portions, wherein each of the pins is soldered to the circuit board substrate.

4. The apparatus of claim 3, wherein the spring portions are positioned between the heat sink and the circuit board substrate.

5. The apparatus of claim 3, wherein the spring portions are positioned on a side of the heat sink that faces away from the circuit board substrate.

6. The apparatus of claim 2, further comprising a spring that comprises the spring portion.

7. An apparatus comprising:

a plurality of pins, wherein each of the pins comprises a spring portion to maintain a spring force between a heat dissipative device and a substrate, wherein the pins and the substrate are coupled via solder connections, and wherein each pin comprises a shaft with a pin head at a first end of the shaft and a pointed pin end at a second end of the shaft, wherein the spring portion forms an integral part of the shaft between the pin head and the pointed pin end of the shaft.

8. The apparatus of claim 7, further comprising an integrated circuit chip coupled between the heat dissipative device and the printed circuit board.

9. The apparatus of claim 7, wherein the spring portion is adjusted to maintain the spring force prior to coupling the pin to the printed circuit board.

10. The apparatus of claim 7, wherein the solder connection comprises a wave solder connection.

11. The apparatus of claim 7, wherein the spring portion is provided between the heat dissipative device and the printed circuit board.

12. The apparatus of claim 7, wherein the spring portion is provided on a side of the heat dissipative device that faces away from the printed circuit board.

13. The apparatus of claim 7, further comprising a spring that comprises the spring portion.

* * * * *